(12) United States Patent
Audibert et al.

(10) Patent No.: US 12,543,405 B2
(45) Date of Patent: Feb. 3, 2026

(54) METHOD OF MANUFACTURING A PHOTONIC DEVICE

(71) Applicant: Commissariat à l'Énergie Atomique et aux Énergies Alternatives, Paris (FR)

(72) Inventors: Margaux Audibert, Grenoble (FR); Amélie Dussaigne, Grenoble (FR); Guillaume Veux, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 19/263,700

(22) Filed: Jul. 9, 2025

(65) Prior Publication Data
US 2026/0020378 A1    Jan. 15, 2026

(51) Int. Cl.
H10H 20/01 (2025.01)

(52) U.S. Cl.
CPC ...... H10H 20/0137 (2025.01); H10H 20/017 (2025.01); H10H 20/034 (2025.01)

(58) Field of Classification Search
CPC .................................. H10H 20/0137
USPC .......................................... 438/35
See application file for complete search history.

(56) References Cited

U.S. PATENT DOCUMENTS

2022/0208848 A1\* 6/2022 Tan ............. H10H 20/821
2022/0209066 A1   6/2022 Tan et al.
2022/0406968 A1  12/2022 Dupre et al.
2024/0072100 A1   2/2024 Park et al.
2024/0186444 A1   6/2024 Dupre et al.

FOREIGN PATENT DOCUMENTS

EP    3840016 A1   6/2021
EP    3840065 A1   6/2021

OTHER PUBLICATIONS

Preliminary Search Report and Written Opinion for French Application No. 2407586, dated Feb. 6, 2025.
Kishino et al., Monolithic integration of four-colour InGaN-based nanocolumn LEDs. Electronics Lett. May 28, 2015;51(11):852-4.
Pasayat et al., Compliant Micron-Sized Patterned InGaN Pseudo-Substrates Utilizing Porous GaN. Materials, Jan. 4, 2020;13(1):213(1-10).

(Continued)

*Primary Examiner* — Hsin Yi Hsieh
(74) *Attorney, Agent, or Firm* — Wolf, Greenfield & Sacks, P.C.

(57) ABSTRACT

A method of manufacturing a photonic device including the following steps: providing a structure including a base substrate covered by (Al,In,Ga)N/(Al,In,Ga)N mesas, a first mesa being fully porosified and having flanks covered by a protective layer, a second mesa being non-porosified, and a third mesa including porosified flanks and a non-porosified central portion, epitaxially growing an active structure including InGaN-based quantum wells simultaneously on the first mesa, the second mesa, and the third mesa, to respectively form a first active structure emitting at a first wavelength, a second active structure emitting at a second wavelength, and a third active structure emitting at a third wavelength.

6 Claims, 4 Drawing Sheets

(56) References Cited

OTHER PUBLICATIONS

Pasayat et al., Demonstration of ultra-small (<10 μm) 632 nm red InGaN micro-LEDs with useful on-wafer external quantum efficiency (>0.2%) for mini-displays. Appl. Phys Express, 2021;14:011004(1-5). Epub. Dec. 16, 2020.

* cited by examiner

METHOD OF MANUFACTURING A PHOTONIC DEVICE

CROSS REFERENCE TO RELATED APPLICATIONS

This application claims priority to French application number FR2407586, filed Jul. 11, 2024. The contents of which is incorporated by reference in its entirety.

TECHNICAL FIELD

The present disclosure generally concerns the field of photonic devices, and more specifically, color microdisplays with native red, green, and blue emissions and short-wave infrared devices.

The invention concerns such photonic devices and their manufacturing methods.

PRIOR ART

Color microdisplays comprise pixels formed of blue, green, and red sub-pixels (RGB pixels). In the rest of the disclosure, these sub-pixels will simply be called pixels, for the sake of brevity.

Blue and green pixels can be manufactured based on nitride materials, and red pixels based on phosphide materials. To combine on the same substrate these three types of pixel, the technique called "pick-and-place" is generally used. However, in the case of microdisplays with pixels smaller than 10 μm, this technique can no longer be used, due, in particular, to alignment problems. For screens with a large number of pixels (high definition), this "pick-and-place" technique raises time problems. Further, the pixels have to be picked from different wafers, which requires a plurality of successive transfers. Parallel transfer techniques can also be used ('mass transfer').

Another solution comprises performing the color conversion with quantum dots (QDs) or nanophosphors pumped by blue μLEDs originating from a single wafer, either transferred or in a monolithic array (preferred case for microdisplays). However, the control of the deposition of these materials on pixels of small dimension is difficult, and their damage threshold is not sufficiently high.

It is thus crucial to be able to obtain the three RGB pixels natively with the same family of materials, having their growth performed on the same substrate. For this purpose, InGaN is the most promising material. This material can indeed theoretically cover the entire visible spectrum, depending on its indium concentration. Blue micro-LEDs based on InGaN already have a high luminance, far greater than their organic counterparts. To emit at wavelengths in green, the quantum wells (PQs) of the LED need to contain at least 25% of indium, and for an emission in red, at least 35% of indium is required. Unfortunately, the quality of the InGaN material above 20% of In is degraded due to the low miscibility of InN in GaN, but also due to the high compressive stress inherent to the growth of the InGaN-on-GaN active area.

It is thus essential to be able to decrease the general stress in GaN/InGaN-based structures.

Currently, one of the most promising solutions is to electrochemically porosify the GaN layer of the mesas, as described, for example, in the two papers by Pasayat et al. (Materials 2020, 13, 213 and Appl. Phys. Express 2021, 14, 011004).

The porosified GaN layer thus obtained can enable to grow an InGaN-based nitride LED structure, due to the relaxation of the generated porous mesas. However, only red emission could be observed.

Recently, it has been shown that a relaxation of the InGaN layer preceding the quantum wells is advantageous to increase the In incorporation rate thereof. The more the lower InGaN layer is relaxed, the higher the In incorporation rate in the upper layer (EP3840065 A1 and EP3840016 A1). Depending on the amount of indium incorporated into the InGaN-based quantum wells, different emitted wavelengths can be obtained.

Currently, this change in the indium concentration is controlled during epitaxy and/or by the lattice parameter a of the substrate. To obtain different wavelengths, it is thus necessary either to carry out a plurality of successive epitaxies or to have mesas having different lattice parameters a on the same substrate.

However, to obtain red emission, it is necessary to achieve a very large lattice parameter in the plane (typically 3.238 Å). Now, such a lattice parameter is difficult to achieve.

SUMMARY OF THE INVENTION

There exists a need to provide a method of manufacturing a photonic device enabling to obtain pixels having different wavelengths, at least one wavelength of which is preferably in red or even in short infrared.

This aim is achieved by a method of manufacturing a photonic device comprising the following steps:
providing a structure comprising a base substrate covered by (Al,In,Ga)N/(Al,In,Ga)N mesas,
a first mesa being fully porosified and having flanks covered by a protective layer, a second mesa being non-porosified, and a third mesa comprising porosifiewd flanks and a non-porosified central portion,
epitaxially growing an active structure comprising, for example, InGaN-based quantum wells, simultaneously on the first mesa, the second mesa, and the third mesa, whereby the active structure on the first mesa emits at a first wavelength, the active structure on the second mesa emits at a second wavelength, and the active structure on the third mesa emits at a third wavelength,
the first wavelength being greater than the second and than the third wavelength,
the third wavelength being shorter than the second wavelength.

According to a specific embodiment, the protective layer is made of silicon nitride.

According to a specific embodiment, the pores of the first mesa and/or of the third mesa have a diameter greater than 20 nm and smaller than 100 nm.

According to a specific embodiment, a protective layer, preferably made of silicon nitride, is deposited on the flanks of the second mesa and/or on the base substrate between mesas.

According to a specific embodiment, the structure is obtained according to the following steps:
providing a base substrate covered by (Al,In,Ga)N/(Al,In,Ga)N mesas, the mesas comprising a heavily-doped (Al,In,Ga)N layer and an undoped or lightly doped (Al,In,Ga)N layer,
depositing a first insulating layer, for example made of resin, on the first mesa and on the second mesa,
partially porosifying the third mesa, whereby the third mesa has porosified flanks and a non-porosified central portion, removing the first insulating layer,
depositing a second insulating layer, for example made of resin, to the second mesa and to the third mesa,
fully porosifying the first mesa,
removing the second insulating layer,
depositing the protective layer on the flanks of the first mesa.

According to a specific embodiment, the structure is obtained according to the following steps:
providing a base substrate covered by a stack comprising a heavily-doped (Al,In,Ga)N layer and an undoped or lightly-doped (Al,In,Ga)N layer,
depositing an insulating layer, for example made of resin, on the stack in line with the first mesa and with the flanks of the third mesa,
implanting the portions of the heavily-doped (Al,In,Ga)N layer not covered by the insulating layer, so as to decrease the doping of the uncovered areas, whereby the (Al,In,Ga)N layer comprises heavily-doped areas and undoped or lightly-doped areas,
removing the insulating layer, and, preferably, performing a thermal anneal,
depositing an additional insulating layer, for example made of resin, openings being formed in the additional insulating layer in line with the first mesa, the second mesa, and the third mesa,
etching the stack through the openings in the additional insulating layer, so as to form the first mesa, the second mesa, and the third mesa,
optionally, removing the additional insulating layer,
porosifying the heavily-doped areas of the (Al,In,Ga)N layer,
depositing the protective layer on the first mesa.

This aim is also achieved by a photonic device comprising a base substrate covered by (Al,In,Ga)N/(Al,In,Ga)N mesas,
a first mesa being fully porosified and having its flanks, preferably, covered by a protective layer, for example made of silicon nitride, a second mesa being non-porosified, and a third mesa comprising porosified flanks and a non-porosified central portion,
the first mesa, the second mesa, and the third mesa being covered, respectively, by a first active structure emitting at a first wavelength, a second active structure emitting at a second wavelength, and a third active structure emitting at a third wavelength,
the first wavelength being greater than the second and than the third wavelengths, the third wavelength being shorter than the second wavelength.

According to a specific embodiment, the device is a microdisplay with native red, green, and blue emissions.

According to a specific embodiment, the wavelengths are in infrared.

According to a specific embodiment, the base substrate comprises a support layer, a first undoped GaN layer, optionally an additional heavily-doped GaN layer, and a second doped GaN layer.

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which.

DESCRIPTION OF EMBODIMENTS

Figure 1A:
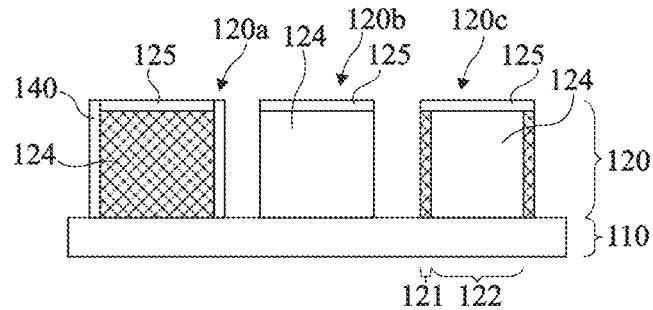
FIG. 1A and FIG. 1B schematically show different steps of a method of manufacturing a photonic device according to a specific embodiment of the invention.

Like features have been designated by like references in the various figures. In particular, the structural and/or functional features that are common among the various embodiments may have the same references and may dispose identical structural, dimensional and material properties.

For the sake of clarity, only those steps and elements that are useful for understanding the described embodiments have been shown and are described in detail.

In the following description, where reference is made to absolute position qualifiers, such as the terms "front", "back", "top", "bottom", "left", "right", etc., or relative position qualifiers, such as the terms "top", "bottom", "upper", "lower", etc., or orientation qualifiers, such as "horizontal", "vertical", etc., reference is made unless otherwise specified to the orientation of the drawings.

Unless specified otherwise, the expressions "about", "approximately", "substantially", and "in the order of" signify plus or minus 10%°, preferably of plus or minus 5%.

Unless otherwise specified, by between X and Y, there is meant that limits X and Y are included within the range.

Although this is by no means limitative, the invention has specific applications in the field of color microdisplays, and more specifically for the manufacturing of red-green-blue pixels.

Typically, an emission in green is at a wavelength in the range from 500 to 550 nm, an emission in red is at a wavelength in the range from 600 to 650 nm, and an emission in blue is at a wavelength in the range from 420 to 480 nm.

The invention is particularly advantageous to manufacture microdisplays for augmented and virtual reality.

However, it may also be used for the manufacturing of LEDs or lasers emitting at long wavelengths. In particular, the invention has applications for devices operating in short-wave infrared (SWIR). By short-wave infrared, there is meant wavelengths in the range from 0.7 to 1.7 µm, and in particular from 0.9 to 1.7 µm.

The invention is particularly advantageous for pixels having dimensions smaller than 10 µm.

The method is particularly advantageous to manufacture structures comprising (Al,In,Ga)N/(Al,In,Ga)N mesas having, in particular, a pitch smaller than 30 μm.

By (Al,In,Ga)N/(Al,In,Ga)N mesas, there is meant that the mesas comprise two (Al,In,Ga)N layers. The (Al,In,Ga)N/(Al,In,Ga)N mesas comprise a lower layer 124 made of (Al,In,Ga)N and an upper undoped or lightly-doped layer 125 made of (Al,In,Ga)N. The upper layer is that on which the epitaxy is performed. It is little or not at all affected by the porosification step. It remains continuous and dense. It ensures the quality of the epitaxial layer, such as an (In,Ga)N layer.

By (Al,In,Ga)N, there is meant AlN, AlGaN, InGaN, or GaN. Hereafter, it is more specifically referred to porous GaN, but with such a method, it is possible to have, for example, porous InGaN or AlGaN. The dense InGaN layer (under compressive stress) or the dense AlGaN layer (under tensile stress) will relax thanks to a porous structure, whatever its composition. It is also possible to replace the GaN of the mesas with a mixture of GaN and InGaN. In this case, one would have porous GaN and porous InGaN, especially for the mesa which will be fully porosified.

Figure 1B:
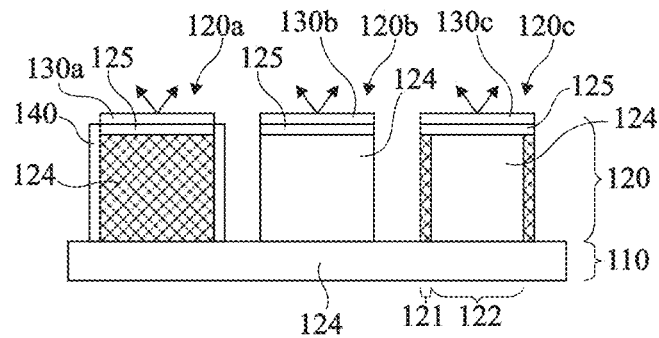

Referring to FIGS. 1A and 1B and to FIGS. 2A and 2B, the photonic device manufacturing method will now be described in greater detail. The method comprises at least the following steps:
i) providing a structure comprising a base substrate 110 covered by (Al,In,Ga)N/(Al,In,Ga)N mesas 120, a first mesa 120a being fully porosified and having its flanks covered by a protective layer 140, a second mesa 120b being non-porosified, and a third mesa 120c comprising porosified flanks 121 and a non-porosified central portion 122 (FIG. 1A, FIG. 2A),
ii) epitaxially depositing an active structure 130, typically a LED structure, comprising in particular InGaN-based quantum wells 132, simultaneously on the first mesa 120a, the second mesa 120b, and the third mesa 120c (FIG. 1B, FIG. 2B).

The same active structure 130 is simultaneously deposited on the three mesas 120a, 120b, 120c.

The amount of indium incorporated into the surface of mesas 120 is more or less significant according, not only to the level of relaxation of mesa 120, but also to the porosity of the flanks 121 of mesas 120. Indeed, pores have the capacity to trap indium atoms at the time of the growth of the epitaxial layer. The control of the exposure of the pores to the growth flows will enable to modulate the indium concentration at the surface of the mesas. One thus obtains, after a single epitaxial regrowth, three types of mesas: 120a, 120b, and 120c, emitting at three different wavelengths.

By fully porosified, there is meant that the lower layer 124 of the first mesa 120a is fully porosified: its entire volume is porosified.

By non-porosified, there is meant that the lower layer 124 of the second mesa 120b is not porosified.

The third mesa 120c is partially porosified. The flanks 121 of the lower layer 124 of the third mesa 120c are porosified and the core 122 of the lower layer 124 of the third mesa 120c is not porosified.

For reasons of readability, each diagram comprises three mesas, one of each type. It should be obvious that the base substrate 110 may be covered by three groups of mesas, each group of mesas comprising a plurality of mesas of one of the three types (that is, a first group of fully porosified mesas 120a, a second group of non-porosified mesas 120b, and a third group of partially porosified mesas 120c).

By flank, there is meant the lateral portion of the lower layer of mesas 120. This portion extends from the edge of the lower layer of the mesas and extends across a thickness of, for example, 50 to 200 nm towards the center of the mesa (typically for a 3-μm wide mesa). The ratio of the thickness of the flank to the width of the mesa is, for example, in the range from 1 to 20%, preferably from 1 to 10%.

The method thus enables to modulate the incorporation of indium as a function of the porosification rate of the flanks 121 of mesas 120 and of the accessibility of the pores on the flanks of mesas 120.

The first mesa 120a is totally porous, and its flanks 121 are protected by protective layer 140. It will provide, after the epitaxial regrowth of the all-InGaN structure, the emission at the longest wavelength, since it will allow the highest InGaN relaxation rate.

The second mesa 120b is non-porous. Its flanks may be protected by a protective layer or unprotected. It will provide an emission at an intermediate wavelength, since the structure will be less relaxed than the structure of the first mesa 120a.

The third mesa 120c has porous flanks 121 and a non-porous core 122. Its flanks 121 are not protected by a protective layer. It will provide the emission at the shortest wavelength, since part of the incident In atoms will be captured by the exposed porous flanks 121.

Thus, it is not necessary to achieve a very large in-plane lattice parameter for red emission, and it is possible to obtain the three primary colors in a single epitaxy.

Typically, an in-plane lattice parameter of 3.212 Å is sufficient for the fully porous mesa 120a emitting in read (particularly for mesas having a height of at least 800 nm and a diameter smaller than 3 μm), to be compared with 3.238 Å in prior art.

The different elements forming the structure provided in step i) and its manufacturing method will now be described in greater detail.

Figure 5:
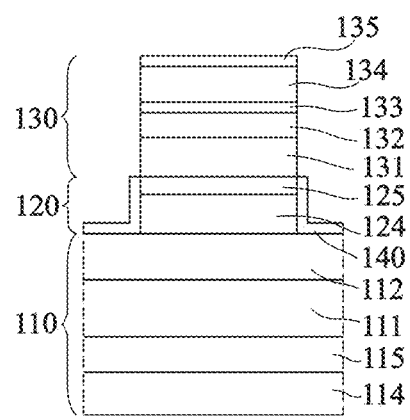
FIG. 5 shows, schematically and in cross-section, an epitaxial LED structure on a non-porous mesa, according to a specific embodiment of the invention.

As shown in FIG. 5, the structure provided at step i) comprises a base substrate 110 covered by mesas 120 (Al,In,Ga)N/(Al,In,Ga)N.

Base substrate 110 successively comprises:
a support substrate 114,
optionally a buffer layer 115 made of (Al,Ga)N, particularly in the case of a silicon support layer 114,
a first undoped GaN layer 111,
optionally an additional heavily-doped GaN layer (not shown),
a second doped GaN layer 112.

The (Al,In,Ga)N/(Al,In,Ga)N mesas 120 arranged on base substrate 110 comprise a third (Al,In,Ga)N layer 124 (that is, the lower layer of the mesa) and a fourth undoped or lightly-doped (Al,In,Ga)N layer 125 (that is, the upper layer of the mesa).

Support substrate 114 is, for example, made of sapphire or of silicon.

Support layer 114 has, for example, a thickness ranging from 250 μm to 2 mm. The thickness depends on the nature of support layer 114 and on its dimensions. For example, for a sapphire support layer having a 2-inch diameter, the thickness may be 350 μm. For a sapphire support layer having a 6-inch diameter, the thickness may be 1.3 mm. For a silicon support layer having a 200-mm diameter, the thickness may be 1 mm.

In the case of a silicon support layer 114, an (Al,Ga)N buffer layer is advantageously interposed between support layer 114 and the non-intentionally doped (nid) GaN layer 111.

The first layer 111 is a nid GaN layer. It is a layer which is not intentionally doped so as not to be porosified. By non-intentionally doped GaN, there is meant a concentration of less than $10^{17}$ at/cm$^3$.

The first nid GaN layer 111 has, for example, a thickness ranging from 500 nm to 5 μm. Advantageously, its thickness is between 1 and 4 μm to absorb the stress associated with the lattice mismatch between GaN and the substrate.

The second layer 112 is a doped GaN layer. By doped GaN, there is meant a concentration, preferably higher than $1.10^{17}$ at/cm$^3$ and preferably lower than $5.10^{18}$ at/cm$^3$ and even more preferably lower than $1.10^{18}$ at/cm$^3$. The presence of electrically-conductive lines enables to have a GaN layer having a concentration lower than $5.10^{17}$ at/cm$^3$ and, for example, between $1.10^{17}$ at/cm$^3$ and $5.10^{17}$ at/cm$^3$.

Insofar as the second doped layer 112 fully covers the additional layer, it ensures the protection of the underlying heavily-doped additional layer from porosification, and also ensures the contacting.

This layer is advantageously as thin as possible (for example, it has a thickness in the range from 400 to 800 nm), while remaining well covering to prevent electrolyte infiltration and thus the consumption of the underlying additional heavily-doped layer during porosification.

The second GaN layer 112 has, for example, a thickness ranging from 200 nm to 1 μm, preferably from 400 to 700 nm. The minimum thickness varies according to the doping level.

The additional heavily-doped GaN layer (not shown) is arranged between the first undoped GaN layer 111 and the second doped GaN layer 112. The additional heavily-doped layer ensures the lateral conduction of charges in the structure.

The additional heavily-doped layer is advantageously thick (typically between 0.5 μm and 5 μm and preferably between 1 and 2 μm). It has, for example, a 2-μm thickness.

For example, the doping level of the additional heavily-doped GaN layer is in the range from $5.10^{18}$ at/cm$^3$ to $2.10^{19}$ at/cm$^3$, preferably from $5.10^{18}$ at/cm$^3$ to $1.5.10^{19}$ at/cm$^3$, even more preferably from $8.10^{18}$ at/cm$^3$ and $1.10^{19}$ at/cm$^3$. The doping level is, for example, $1.10^{19}$ at/cm$^3$.

The structure thus comprises a bilayer or a trilayer comprising two or three layers based on doped GaN having different dopings. The bilayer or the trilayer is positioned between the first undoped GaN layer 111 of the substrate and the fourth undoped or lightly-doped (Al,In,Ga)N layer 125 of mesas 120. The second layer 112 has a lighter doping level than the additional layer, and may be used to form the electrical contact.

The third layer 124 is, at the beginning of the method of manufacturing the structure provided at step i), a heavily-doped GaN layer. By heavily-doped GaN, there is meant a concentration greater than $5.10^{18}$ at/cm$^3$, preferably greater than $8.10^{18}$ at/cm$^3$, or even greater than $10^{19}$ at/cm$^3$. It has, for example, a doping ten times greater than that of second layer 112. It has a thickness in the range from 200 nm to 2 μm. Preferably from 500 nm to 1 μm. Preferably, the doping of the third layer 124 is greater by a factor 30 or even by a factor 100 than the doping of the second layer 112.

As will be seen later, the doping of the third layer may be decreased or even eliminated, at the core 122 and/or the flanks 121 of the mesa. The third layer is then completely or partially undoped or lightly doped. By lightly doped, there is meant a doping between $1.10^{17}$ at/cm$^3$ and $5.10^{17}$ at/cm$^3$. By non-doped, there is meant a doping level lower than $1.10^{17}$ at/cm$^3$.

Further, depending on the mesas and on their manufacturing method, the third (Al,In,Ga)N layer 124 of the structure provided at step i) may comprise:
- a core 122 and heavily-doped porosified flanks 121 (first mesa 120a),
- a non-porosified core 122 and flanks 121, where the core 122 and the flanks may be heavily doped, undoped, or lightly doped (second mesa 120b),
- a non-porosified core 122 and heavily-doped porosified flanks 121, where the core may be heavily doped or undoped or lightly doped (third mesa).

The fourth layer 125 is a non-intentionally doped or lightly-doped (Al,In,Ga)N layer. By lightly-doped (Al,In,Ga)N there is meant a doping between $1.10^{17}$ at/cm$^3$ and $1.10^{18}$ at/cm$^3$. By non-doped, there is meant a doping level lower than $1.10^{17}$ at/cm$^3$.

It may be an AlN, AlGaN, InGaN, or GaN layer. It has, for example, a thickness between 10 nm and 200 nm, preferably between 50 nm and 200 nm. The doping is sufficiently low for this layer to be electrically insulating. It is not porosified during the porosification step.

This layer 125 is little or not at all affected by porosification and is used as a seed layer for a regrowth. This layer 125 is continuous to ensure the quality of the epitaxially regrown layer, of an (In,Ga)N layer for example, on the structure.

According to another alternative embodiment, the first part of the n-InGaN buffer layer 131 of active structure 130 may be formed before the forming of mesas 120. This first part may have a thickness in the range from 50 to 200 nm. This first part here is non-intentionally doped (nid). According to this variant, it is not necessary to have the nid-GaN layer. The second part of the n-InGaN buffer layer will be formed during the epitaxial regrowth on mesas.

The voltages applied during the porosification will be selected according to the doping of the various previously-mentioned layers, and in particular of the second layer 112 and of the third layer 124.

In particular, the respective doping rates are selected so that, at a given potential, there is a selectivity between the heavily-doped area and the lightly-doped area. For a given potential, the doping rate of the second layer 112 is selected so that the second layer 112 is not porosified during the porosification step, and the doping rate of the third layer 124 is selected so that the third layer 124 is porosified during the porosification step.

The flanks of the first mesa 120a are covered by a protective layer 140. It is, for example, a dielectric material. Preferably, the material is a nitride, even more preferably a silicon nitride. The thickness of the protective layer is, for example, in the range from 20 to 100 nm, preferably from 20 to 50 nm.

Hereafter, an n-type doping is described, but it could also be a p-type doping. Those skilled in the art will select the porosification parameters according to the doping type. Mesas 120, also known as elevations, are raised elements.

Preferably, the sides of mesas 120 are perpendicular to this stack of layers.

The surface of the mesas may be circular, hexagonal, square, or rectangular. It is preferably circular. The diameter of the mesas is, for example, in the range from 3 to 4 μm.

The height of the mesas is, for example, in the range from 0.8 to 1.2 μm.

The thickness of the mesas corresponds to the dimension of the mesa perpendicular to the underlying stack.

The pitch (or pattern period) may range from a few micrometers to a few tens of micrometers. It is preferably in the range from 50 nm to 20 µm. Even more preferably, it is in the range from 1 to 10 µm. It is, for example, 5 µm.

The structure provided at step i) can be obtained according to different alternative embodiments.

Figure 3A:
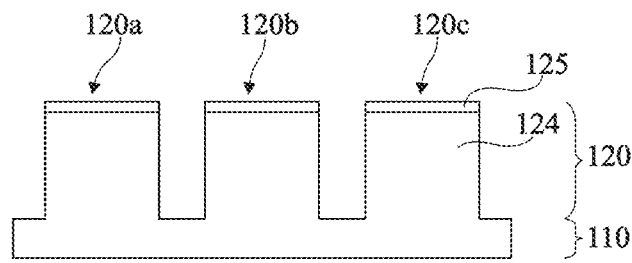
FIG. 3A, FIG. 3B, FIG. 3C, and FIG. 3D schematically show different steps of a mesa porosification method according to another specific embodiment of the invention.
Figure 3B:
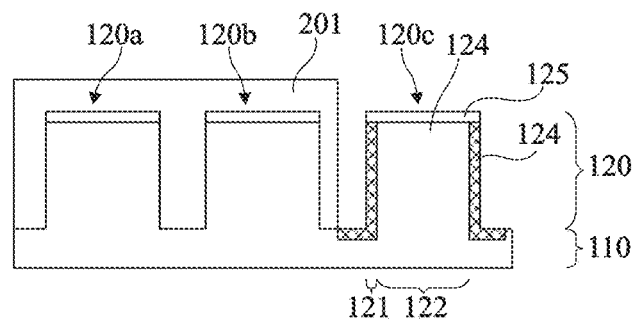
Figure 3C:
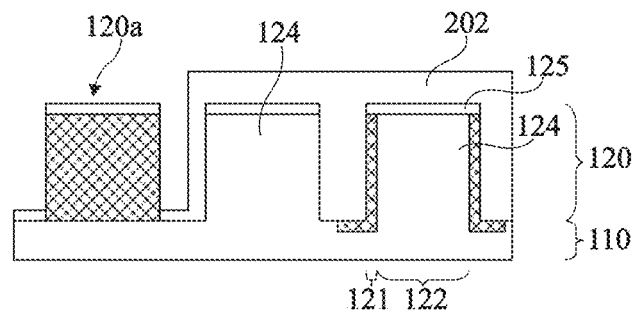
Figure 3D:
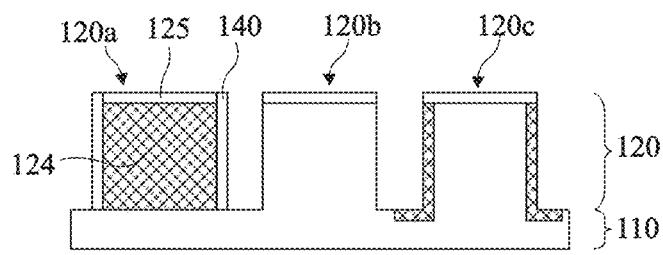

According to a first alternative embodiment, for example shown in FIGS. 3A to 3E, the method of porosifying (Al,In,Ga)N/(Al,In,Ga)N mesas 120 comprises the following steps:

a) providing a base substrate 110 covered by non-porosified (Al,In,Ga)N/(Al,In,Ga)N mesas (120) (FIG. 3A), the mesas comprising a doped (Al,In,Ga)N layer 124 covered by an undoped (Al,In,Ga)N layer 125, b) depositing a first insulating layer 201, for example made of resin, on the first mesa 120a and on the second mesa 120b, c) partially porosifying the third mesa 120c, whereby the third mesa 120c has porosified flanks 121 and a non-porosified central portion 121 (FIG. 3B), d) removing the first insulating layer 201, e) applying a second insulating layer 202, for example made of resin, to the second mesa 120b and to the third mesa 120c, f) fully porosifying the first mesa 120a (FIG. 3C), g) removing the second insulating layer 202, h) depositing protective layer 140 on first mesa 120a (FIG. 3D).

The structure of FIG. 1A is thus obtained.

At step a), mesas 120 are already formed. They are obtained, for example, by etching the fourth layer 125 and the third layer 124. The etching is carried out in such a way as to leave only a number of "reliefs" formed from these layers.

The etching is preferably carried out with a hard mask which exhibits a favorable selectivity with the etch rate of the GaN layers (typically with an etch rate ratio>1/4). The hard mask is for example made of $SiO_2$. After etching of the mesas, this hard mask is removed by a wet chemical process.

The etching is, for example, a chlorinated plasma etching.

Thus, a structure comprising a base substrate 110 topped with a plurality of mesas 120 made of (Al,In,Ga)N/(Al,In,Ga)N is obtained.

At step b), a first insulating layer 201, preferably made of resin, is deposited. It is, for example, deposited so as to expose the third mesa 120c. It protects the first mesa 120a and the second mesa 120b.

The resin may be replaced with any electrically-insulating material, provided for it to be compatible with the porosification conditions and with the level of contamination required by the epitaxy equipment.

During step c), the flanks 121 of the third mesa 120c are porosified. The duration is selected so as to only porosify the flanks 121 of the mesa. For example, the porosification is carried out for a few seconds. This leads to the forming of large pores (typically some hundred nm long in the direction perpendicular to the c axis).

After removal of the first insulating layer 201 at step d), a second insulating layer 202 (made of resin or another insulating material) is deposited (step e)). It covers the second mesa 120b and the third mesa 120c.

During step f), the first mesa 120a is fully porosified. The duration is selected so as to porosify the entire mesa layer 124. This leads to the forming of large pores (typically some hundred nm long in the direction perpendicular to the c axis).

During step g), the second insulating layer 202 is removed.

During step h), a protective layer 140 is deposited on the flanks of the first mesa 120a and, optionally, at the bottom of the mesa.

The order of steps g) and h) can be reversed.

Protective layer 140 is deposited on the flanks of the totally porous mesa 120a, to maximize indium incorporation at the top of these mesas, via the relaxation of the InGaN obtained by porosification of the mesas.

During this step, protective layer 140 may also be deposited on the flanks of the second, non-porous mesa 120b.

Protective layer 140 may be deposited on the substrate between mesas 120. It is also possible to deposit it on the substrate at the bottom of the mesas for mesas 120a and 120b, but not for mesas 120c.

The choice of the positioning of protective layer 140 (flanks and bottom of mesas) enables to influence the effect of indium capture by the pores.

With this method, the first mesa 120a comprises a heavily-doped porosified layer of (Al,In,Ga)N 124.

The second mesa 120b comprises a heavily-doped, non-porosified layer of (Al,In,Ga)N 124.

The third mesa 120c is partially porosified. One part of (Al,In,Ga)N layer 124 is heavily-doped and forms core 122, and the other part of (Al,In,Ga)N layer 124 is heavily-doped and porosified and forms flanks 122.

Figure 4A:
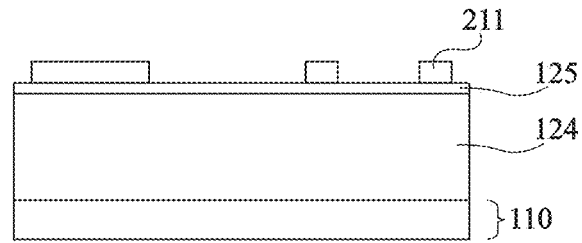
FIG. 4A, FIG. 4B, FIG. 4C, FIG. 4D, FIG. 4E, and FIG. 4F schematically show different steps of a mesa porosification method according to another specific embodiment of the invention.
Figure 4B:
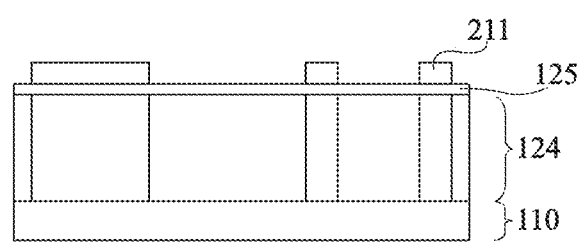
Figure 4C:
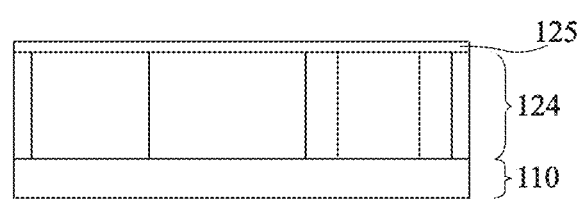
Figure 4D:
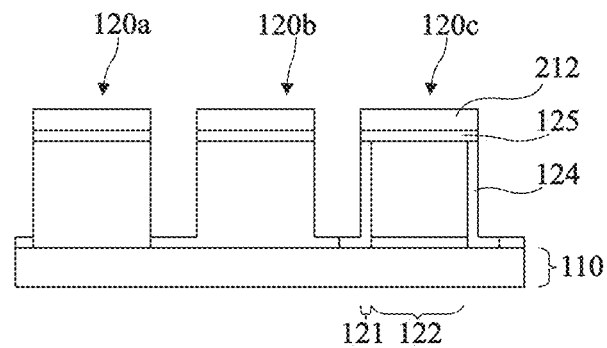
Figure 4E:
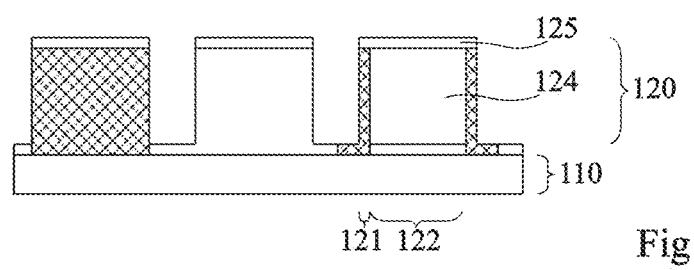
Figure 4F:
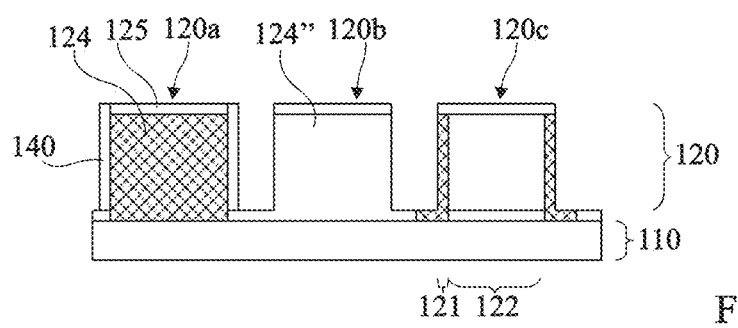

According to a second alternative embodiment, for example shown in FIGS. 4A to 4F, the structure is obtained according to the following steps:

a') providing a base substrate 110 covered by a stack comprising a heavily-doped (Al,In,Ga)N layer 124 and an undoped (Al,In,Ga)N layer 125, b') depositing an insulating layer 211 on the undoped (Al,In,Ga)N layer 125 in line with the first mesa 120a and the flanks 121 of the third mesa 120c (FIG. 4A), c') implanting the areas not covered by the insulating layer 211, so as to decrease their doping (FIG. 4B), whereby (Al,In,Ga)N layer 124 comprises heavily-doped and undoped areas, d') performing an anneal and removing resin 211, (FIG. 4C), e') depositing another insulating layer 212, for example made of resin, openings being formed in this other insulating layer 212 in line with the first mesa 120a, the second mesa 120b, and the third mesa 120c, f') etching the stack through the openings in resin 212, to form first mesa 120a, second mesa 120b, and third mesa 120c (FIG. 4D), g') removing the other insulating layer 212, h') porosifying the heavily-doped areas (FIG. 4E), i') depositing protective layer 140 on the first mesa 120a (FIG. 4F).

This second variant is based on the implementation of an implantation to decrease or even eliminate the doping of selected areas, so as to obtain heavily-doped areas and undoped or lightly-doped areas. Only the heavily-doped areas will be porosified.

Alternatively, it is possible to carry out an alternative embodiment implementing a doping step, for example of type n, by implantation. For such a variant, a nid layer is implanted, for example with silicon, in the areas to be porosified. An anneal is then carried out.

The number of technological steps (such as resin deposition and removal) is decreased, and the desired final structure is obtained in a single porosification step.

During step b'), an insulating layer 211 is deposited. It has openings in line with the areas which are desired to be implanted. The areas protected by insulating layer 211 will not be implanted at step c'). It for example is a $Si_3N_4$ layer, which may have a 20-nm thickness. It will be removed before the epitaxial regrowth.

During step c'), an implantation is performed. The implanted areas will then be de-doped. For example, for n-doped layers, it is possible to implant helium to make these areas less doped or undoped.

During step d'), an anneal is carried out. The anneal enables to remedy the defects created during the implantation. These defects might modify the porosification rate during step h').

During step e'), another insulating layer 212 is deposited. Openings being formed in the resin in line with the first mesa 120a, the second mesa 120b, and the third mesa 120c. Then, during step f), the stack is etched to form mesas 120.

Step g') may be carried out after step h') or after step i').

During step h'), a porosification is performed. Thanks to the modulation of the doping by implantation, only the non-implanted parts are porosified, the three desired types of mesas 120 (that is, a first totally porous mesa 120a, a second non-porous mesa 120b, a third mesa 120c having a non-porous center and porous flanks) are thus obtained. The duration is selected so as to fully porosify the first mesa 120a.

During step i'), a protective layer 140 is deposited on the flanks of the first porous mesa 120a. This enables to maximize the incorporation of indium at the top of these mesas during the epitaxy of the active area (LED).

A protective layer may or may not be applied to the sides of the second, non-porous mesa 120b and/or between the mesas.

Figure 2A:
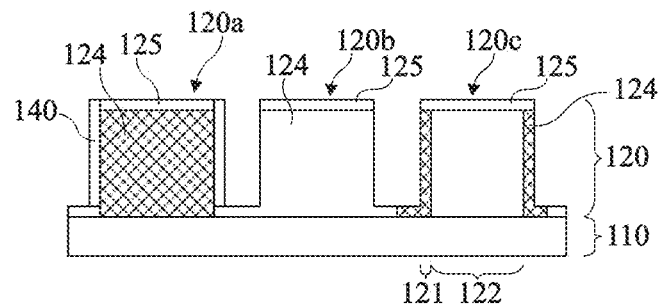
FIG. 2A and FIG. 2B schematically show different steps of a method of manufacturing a photonic device according to another specific embodiment of the invention.
Figure 2B:
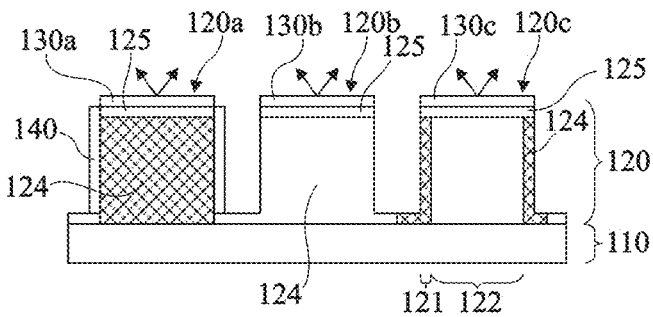

The structure shown in FIG. 2A is thus obtained.

With this method, the (Al,In,Ga)N 124 layer of the first mesa is a porosified layer.

The (Al,In,Ga)N layer 124 of the second mesa 120b is a non-porosified layer.

For the third mesa, the flanks 121 of the (Al,In,Ga)N 124 layer are porosified. The core 122 of the (Al,In,Ga)N 124 layer is not porosified.

For the various alternative embodiments, the various previously-described porosification steps may be carried out according to the following sub-steps:
- electrically coupling structure 100 and a counter-electrode to a voltage or current generator,
- immersing the structure and the counter-electrode into an electrolytic solution,
- applying a voltage or a current between the second doped GaN layer 112 and the counter-electrode, so as to partially or totally porosify the third heavily-doped (Al,In,Ga)N layer 124 of mesas 120.

The structure and a counter-electrode (CE) are electrically coupled to a voltage or current generator. The device acts as a working electrode (WE). Hereafter, it will be referred to as a voltage generator, but it could also be a current generator, enabling to apply a current between the device and the counter-electrode.

The contacting is performed on the structure.

In particular, the contacting may be performed on base substrate 110. The contacting area may be formed on the second doped GaN layer 112. The contacting area may be formed at the bottom of the mesas, on the second layer 112, which enables to use the etching step to also form the contacting areas. Alternatively, it is possible to form the contacting areas on the electrically-conductive lines.

It is also possible to make contact on one of the other layers: on the fourth lightly-doped (Al,In,Ga)N layer 125 or on the third heavily-doped (Al,In,Ga)N layer 124. In the case of a contacting area on the heavily-doped layer, its opening will advantageously be limited to an area preserved from the electrolyte.

The contacting area may also be topped with a metal layer to improve the contact for the electrochemical polarization. This contact will be removed after porosification, prior to the epitaxial regrowth.

The counter-electrode is made of an electrically-conductive material, such as for example a metal with a large developed surface area and inert to the chemistry of the electrolyte, such as a platinum mesh.

The electrodes are immersed into an electrolyte, also known as an electrolyte bath or electrolyte solution. The electrolyte may be acidic or basic. The electrolyte is, for example, oxalic acid. It may also be KOH, HF, $HNO_3$, $NaNO_3$, or $H_2SO_4$.

The voltage applied between the structure and the counter-electrode may range from 1 to 50 V, for example. Preferably, it is from 7 to 16 V. The voltage is selected according to the doping levels of the different layers, in order to obtain the desired selectivity. It is applied, for example, for a period ranging from a few seconds to several hours.

A monitoring the chronoamperometry curve during the porosification enables to see a significant decrease in the current when the layer to be porosified is fully porosified.

For example, the porosification step is carried out by applying a voltage in an oxalic acid solution. The stopping the process is controlled with the current drop.

The electrochemical anodizing step may be carried out under ultraviolet (UV) light.

The largest dimension (the height) of the pores may vary from a few nanometers to a few micrometers. The smallest dimension (the diameter) may vary from a few nanometers to some hundred nanometers, in particular from 30 to 70 nm.

The obtained porosification (porosity rate and pore size) depends on the doping of the layer and on the parameters of the process (applied voltage, duration, nature and concentration of the electrolyte, chemical post-treatment or anneal). The variation in porosification enables to control the incorporation/segregation rate. The porosification, and in particular the pore size, may subsequently vary, at the epitaxial regrowth, according to the applied temperature.

The mesas 120 of a same plate are thus porosified, whether for small or medium-size substrates, or for large substrates.

The bottom of the mesas may be preserved from porosification or porosified.

At step ii), an epitaxy is carried out on mesas 120, whereby an at least partially relaxed, and preferably fully relaxed, epitaxial layer is obtained.

The relaxation percentage corresponds to:

$$\Delta a/a = (a_{c2} - a_{c1})/a_{c1}$$

with $a_{c1}$ the lattice parameter of the initial layer on which the epitaxy is resumed (that is, the lattice parameter of layer 125), and $a_{c1}$ the lattice parameter of the relaxed layer, The layer is 100% relaxed if $a_{c2}$ corresponds to the lattice parameter of the bulk material of same composition as the epitaxially regrown layer.

When $a_{c1} = a_{c2}$ the layer is said to be strained.

By partially relaxed, there is meant a relaxation percentage greater than 50%.

Epitaxial regrowth may be used, for example, to form epitaxially regrown LEDs.

The epitaxial regrowth is carried out on the fourth (Al, In,Ga)N/(Al,In,Ga)N nid or lightly-doped layer 125 of mesas 120. Since this layer is not porosified during the electrochemical anodizing step, it remains continuous and dense. Epitaxial regrowth is thus facilitated and the epitaxial layer has a better hold. The creation of defects due to pore coalescence is avoided.

The layer epitaxially grown during this step is, advantageously, made of gallium nitride or of indium gallium nitride.

The same epitaxy process (that is, the same epitaxy conditions) is applied to the 3 mesas, thus generating 3 different structures emitting at 3 different wavelengths.

The epitaxy conditions are, for example, selected to generate an all-InGaN green LED structure on mesas 120b. The same conditions will generate other structures on neighboring mesas. The three mesas will not have the same final structure (different thickness, indium concentration, emission wavelength).

In particular, it is an all-InGaN LED structure. LED structure 130 comprises, for example, an n-InGaN buffer layer 131, an InGaN/(Ga,In)N active area 132 comprising quantum wells (QW), a p-InGaN layer 134, and a heavily-doped InGaN layer 135. The growth conditions are adapted to obtain the desired wavelength. In particular, growth conditions will be selected to obtain a green emission on the second, non-porous mesa.

As shown in FIG. 5, the LED structure 130 on mesa 120 comprises, for example, the following layers:
an n-doped $In_xGa_{1-x}N$ buffer layer 131, with x between 7 and 8% (for example having a 400-nm thickness),
an active area 132 comprising quantum wells, the active area comprising, for example, a 5 x $In_yGa_{1-y}N/In_xGa_{1-x}N$ multilayer with y=25% (for example having 2.5 nm/6 nm thicknesses),
a p-doped AlGaN layer 133 ('electron blocking layer' (EBL)) (for example having a 20-nm thickness),
a p-doped InGaN layer 134 (for example having a 150-nm thickness),
a p++ doped InGaN layer 135 (for example having a 20-nm thickness).

The modulation of indium incorporation from one type of mesa to another is made possible due to the exposure or not of areas porous to incident fluxes. The pores in particular trap part of the indium atoms.

Since, on the one hand, the porosification rate is different in each mesa, and, on the other hand, the accessibility of the pores differs, the amount of incorporated indium will be different. Thus, the first LED structure 130a on the first mesa 120a emits at a first wavelength, the second LED structure 130b on the second mesa 120b emits at a second wavelength, and the third LED structure 130c on the third mesa 120c emits at a third wavelength. The first wavelength is greater than the second and third wavelengths. The third wavelength is shorter than the second wavelength.

The temperatures used during the epitaxy are, for example, in the range from 700 to 850° C. Preferably, they are in the range from 750 to 850° C. for n-InGaN and p-InGaN, between 70° and 800° C. for the quantum wells of the active area, and between 75° and 850° C. for the barriers of the active area.

Figure 6:
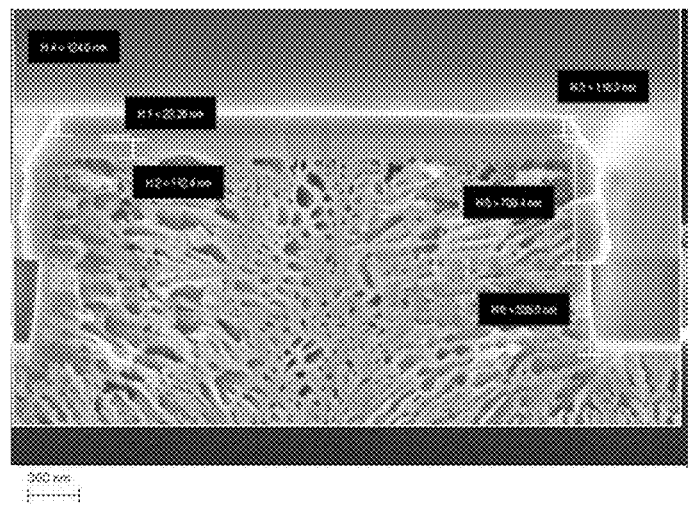
FIG. 6 is an image obtained with a scanning electron microscope of a fully porosified mesa obtained according to a specific embodiment of the invention.
Figure 7:
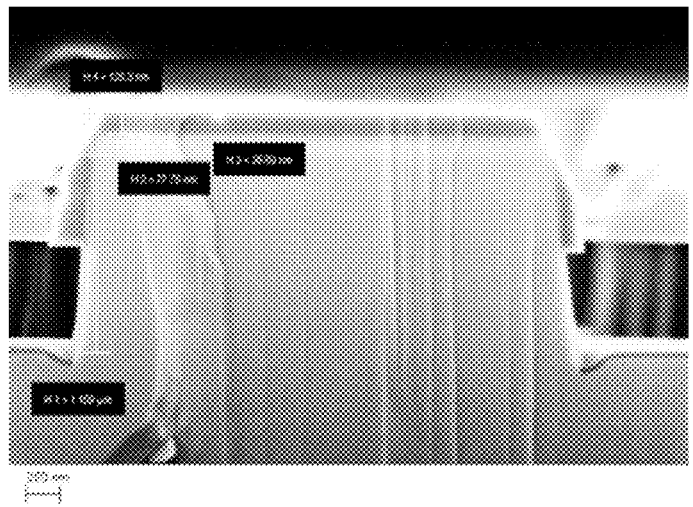
FIG. 7 is an image obtained with a scanning electron microscope of a non-porosified mesa obtained according to a specific embodiment of the invention.

As an non-limiting illustration, the In concentration of the epitaxial InGaN layer on porous mesas (FIG. 6) having apparent pores of the flanks and of the interval between mesas and on non-porous mesas (FIG. 7) have been compared. For porous mesas, an In concentration of 3% is obtained, and for non-porous mesas, more than 6% of indium. A factor 2 is observed for the same epitaxy. This is not the case if an SiN protective layer (liner) protects the sides of the porous mesas and the interval between mesas.

Figure 8:
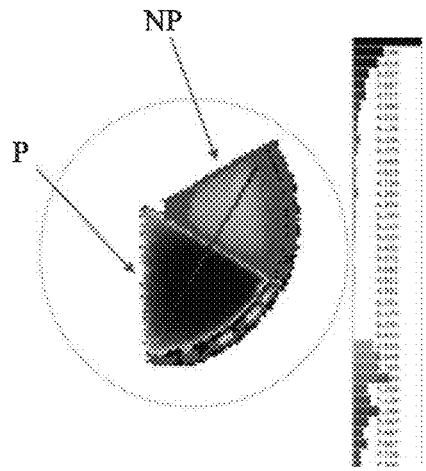
FIG. 8 shows various photoluminescence measurements, at room temperature (typically between 2° and 25° C.), on porous mesas (noted P in FIG. 8) and non-porous mesas (noted NP in FIG. 8) on which the same LED structure has been epitaxially grown during the same epitaxy, according to different specific embodiments of the invention.

These observations have been confirmed by photoluminescence measurements on both types of samples at room temperature (FIG. 8).

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. Method of manufacturing a photonic device comprising the following steps:
providing a structure comprising a base substrate covered by (Al,In,Ga)N/(Al,In,Ga)N mesas,
a first mesa being fully porosified and having flanks covered by a protective layer, a second mesa being non-porosified, and a third mesa comprising porosified flanks and a non-porosified central portion,
epitaxially growing an active structure comprising InGaN-based quantum wells, simultaneously on the first mesa, the second mesa, and the third mesa, whereby the active structure on the first mesa emits at a first wavelength, the active structure on the second mesa emits at a second wavelength, and the active structure on the third mesa emits at a third wavelength,
the first wavelength being greater than the second and than the third wavelength,
the third wavelength being shorter than the second wavelength.

2. Method according to claim 1, wherein the protective layer is made of silicon nitride.

3. Method according to claim 1, wherein the pores of the first mesa and/or of the third mesa have a diameter greater than 20 nm and smaller than 100 nm.

4. Method according to claim 1, wherein a protective layer made of silicon nitride, is arranged on the flanks of the second mesa and/or on the base substrate between the mesas.

5. Method according to claim 1, wherein the structure is obtained according to the following steps:
providing the base substrate covered by (Al,In,Ga)N/(Al,In,Ga)N mesas (120), the mesas comprising a heavily-doped (Al,In,Ga)N layer and an undoped or lightly-doped (Al,In,Ga)N layer,
depositing a first insulating layer made of resin, on the first mesa and on the second mesa,
partially porosifying the third mesa, whereby the third mesa has porosified flanks and a non-porosified central portion,
removing the first insulating layer,
depositing a second insulating layer made of resin, on the second mesa and on the third mesa,
fully porosifying the first mesa,
removing the second insulating layer,
depositing the protective layer on the sides of the first mesa.

6. Method according to claim 1, wherein the structure is obtained according to the following steps:
providing the base substrate covered by a stack comprising a heavily-doped (Al,In,Ga)N layer and an undoped or lightly-doped (Al,In,Ga)N layer, depositing an insulating layer made of resin, on the stack in line with the first mesa and with the flanks of the third mesa, implanting parts of the heavily-doped (Al,In,Ga)N layer not covered by the insulating layer, so as to decrease a doping of the uncovered areas, whereby the (Al,In,Ga)N layer comprises heavily-doped areas and undoped or lightly-doped areas, removing the insulating layer, and performing a thermal anneal, depositing an additional insulating layer made of resin, openings being formed in the additional insulating layer in line with the first mesa, the second mesa, and the third mesa, etching the stack through the openings in the additional insulating layer so as to form the first mesa, the second mesa, and the third mesa, removing the additional insulating layer, porosifying the heavily-doped areas of the (Al,In,Ga)N layer, depositing the protective layer on the first mesa.

\* \* \* \* \*